US011335400B2

(12) United States Patent
Wang

(10) Patent No.: US 11,335,400 B2
(45) Date of Patent: May 17, 2022

(54) COMPUTING-IN-MEMORY CHIP AND MEMORY CELL ARRAY STRUCTURE

(71) Applicant: Beijing Zhicun (Witin) Technology Corporation Ltd., Beijing (CN)

(72) Inventor: Shaodi Wang, Beijing (CN)

(73) Assignee: Beijing Zhicun (Witin) Technology Corporation Ltd., Beijing (CN)

( * ) Notice: Subject to any disclaimer, the term of this patent is extended or adjusted under 35 U.S.C. 154(b) by 0 days.

(21) Appl. No.: 17/160,292

(22) Filed: Jan. 27, 2021

(65) Prior Publication Data

US 2021/0151106 A1 May 20, 2021

Related U.S. Application Data

(63) Continuation of application No. PCT/CN2019/094769, filed on Jul. 5, 2019.

(51) Int. Cl.
*G11C 16/04* (2006.01)
*G11C 16/24* (2006.01)
(Continued)

(52) U.S. Cl.
CPC .......... *G11C 13/0028* (2013.01); *G06F 17/16* (2013.01); *G11C 13/0004* (2013.01);
(Continued)

(58) Field of Classification Search
CPC ... G06F 17/16; G11C 13/0038; G11C 13/004; G11C 13/0069; G11C 11/1655;
(Continued)

(56) References Cited

U.S. PATENT DOCUMENTS

2013/0051161 A1* 2/2013 Tanzawa ............ G11C 16/3418
365/189.09
2019/0042199 A1* 2/2019 Sumbul .................... G11C 8/08
(Continued)

FOREIGN PATENT DOCUMENTS

CN 100530430 C 8/2009
CN 103177758 A 6/2013
(Continued)

OTHER PUBLICATIONS

International Search Report / Written Opinion, PCT/CN2019/094769, dated Mar. 12, 2020, 7 pgs.
(Continued)

*Primary Examiner* — Hien N Nguyen
(74) *Attorney, Agent, or Firm* — Morgan, Lewis & Bockius LLP

(57) ABSTRACT

In a computing-in-memory chip and a memory cell array structure, a memory cell array therein includes a plurality of memory cell sub-arrays arranged in an array. Each memory cell sub-array comprises a plurality of switch units and a plurality of memory cells arranged in an array; and first terminals of all memory cells in each column are connected to a source line, second terminals of all the memory cells are connected to a bit line, third terminals of all memory cells in each row are connected to a word line through a switch unit, a plurality of rows of memory cells are correspondingly connected to a plurality of switch units, control terminals of the plurality of switch units are connected to a local word line of the memory cell sub-array, and whether to activate the memory cell sub-array is controlled by controlling the local word line.

18 Claims, 10 Drawing Sheets

(51) Int. Cl.
  *G11C 29/04* (2006.01)
  *G11C 13/00* (2006.01)
  *G06F 17/16* (2006.01)
(52) U.S. Cl.
  CPC ........ *G11C 13/004* (2013.01); *G11C 13/0026* (2013.01); *G11C 13/0038* (2013.01); *G11C 13/0069* (2013.01)
(58) Field of Classification Search
  CPC ..... G11C 11/54; G11C 16/08; G11C 16/0408; G11C 16/0483; G11C 16/10; G11C 16/24
  See application file for complete search history.

(56) References Cited

U.S. PATENT DOCUMENTS

| | | | |
|---|---|---|---|
| 2019/0057727 A1 | 2/2019 | Mathuriya et al. | |
| 2019/0213234 A1* | 7/2019 | Bayat | G11C 11/54 |
| 2020/0192971 A1* | 6/2020 | Lue | G11C 16/26 |
| 2020/0211649 A1* | 7/2020 | Park | G11C 29/42 |
| 2020/0335511 A1* | 10/2020 | Tran | G06N 3/08 |

FOREIGN PATENT DOCUMENTS

| | | |
|---|---|---|
| CN | 108777155 A | 11/2018 |
| CN | 209766043 U | 12/2019 |

OTHER PUBLICATIONS

Patil, A.D. et al., "An MRAM-Based Deep in Memory Architecture for Deep Neural Networks", IEEE International Symposium on Circuits and Systems (ISCAS), May 1, 2019, (May 1, 2019), ISSN: 2158-1525, p. 1, left-hand column, paragraph 1 to p. 2, right-hand column, paragraph 1.

* cited by examiner

COMPUTING-IN-MEMORY CHIP AND MEMORY CELL ARRAY STRUCTURE

RELATED APPLICATIONS

This application is a continuation of PCT Application No. PCT/CN2019/094769, filed Jul. 5, 2019, which claims priority to Chinese Patent Application No. 201910563395.9, filed Jun. 26, 2019, each of which is hereby incorporated by reference in its entirety.

TECHNICAL FIELD

The present invention relates to the field of semiconductor integrated circuits, and in particular to a computing-in-memory chip and a memory cell array structure.

BACKGROUND

In recent years, in order to overcome the bottleneck of the architecture of the classical von Neumann computing architecture, a computing-in-memory chip architecture has drawn extensive attention. The basic idea thereof is to directly use a memory for logic computing, thereby reducing the amount of data transmission and the transmission distance between the memory and the processor, and reducing power consumption while improving performance.

The computing-in-memory chip architecture is currently considered to be one of the efficient hardware platforms for real-time and intelligent processing of big data, and a memory cell array is the core circuit of the computing-in-memory chip. A typical memory cell array needs to be equipped with peripheral circuits such as a digital-to-analog converter, an analog-to-digital converter, and a conversion apparatus.

In order to meet requirements of complex operations, the computing-in-memory chip is usually provided with a plurality of memory cell arrays to perform different operational tasks. Each of the plurality of memory cell arrays needs to be provided with corresponding peripheral circuits such as a digital-to-analog converter, an analog-to-digital converter, a conversion apparatus, and a decoder. The areas of the peripheral circuits, especially the areas of an ADC and a DAC, are usually much greater than that of the memory cell array, and the cost thereof is high. Therefore, the existing computing-in-memory chip architecture occupies a large circuit area and causes a high cost, and cannot meet the requirements for integration and a low cost.

SUMMARY

According to an aspect of the present disclosure, a computing-in-memory chip is provided, comprising: a digital-to-analog converter configured to convert a received digital signal into an analog signal, and output the analog signal; a memory cell array configured to receive the analog signal from the digital-to-analog converter, perform an analog vector-matrix multiplication operation on the analog signal and output an analog operation result of the analog vector-matrix multiplication operation, wherein the memory cell array comprises: a plurality of memory cell sub-arrays arranged in an array, which is configured to perform different analog vector-matrix multiplication operations, wherein the memory cell sub-array comprises a plurality of switch units and a plurality of memory cells arranged in an array, wherein for each memory cell, a threshold voltage of the memory cell is adjustable, a first terminal of the memory cell is connected to a source line corresponding to the column of the memory cell sub-array where the memory cell is located, a second terminal of the memory cell is connected to a bit line corresponding to the column of the memory cell sub-array where the memory cell is located, a third terminal of the memory cell is connected to a word line corresponding to the row of the memory cell sub-array where the memory cell is located through a switch unit corresponding to the row of the memory cell sub-array where the memory cell is located, for each switch unit, the control terminal of the switch unit is connected to a local word line corresponding to the memory cell sub-array; an analog-to-digital converter configured to receive the analog operation result from the memory cell array and convert the analog operation result into a digital output signal, wherein whether each memory cell sub-array is activated is controlled via the local word line corresponding to the memory cell sub-array.

Further, controlling whether to activate the memory cell sub-array via the local word line corresponding to the memory cell sub-array comprises: when the local word line corresponding to the memory cell sub-array controls the memory cell sub-array to be activated, the local word line corresponding to the memory cell sub-array controls all switch units in the memory cell sub-array to be in a closed state; when the local word line corresponding to the memory cell sub-array controls the memory cell sub-array to be inactivated, the local word line corresponding to the memory cell sub-array controls all switch units in the memory cell sub-array to be in an open state.

Further, each switch unit comprises: a first switch element; and a second switch element; wherein a first terminal of the first switch element receives a first level, a second terminal of the first switch element is connected to a first terminal of the second switch element, a second terminal of the second switch element is connected to a word line corresponding to the switch unit, a third terminal of the first switch element and a third terminal of the second switch element are both connected to the local word line corresponding to the memory cell sub-array where the switch unit is located, and third terminals of all memory cells in a row of the memory cell sub-array corresponding to the switch unit are connected to a connection point of the second terminal of the first switch element and the first terminal of the second switch element.

Further, when the memory cell sub-array where the switch unit is located is activated, the first switch element of the switch unit is in off state, and the second switch element of the switch unit is in on state.

Further, when the memory cell sub-array where the switch unit is located is inactivated, the first switch element of the switch unit is in on state, and the second switch element of the switch unit is in off state.

Further, the memory cell is a programmable semiconductor device.

Further, the programmable semiconductor device is a floating gate transistor.

Further, the memory cell comprises: a non-volatile memory device; and a third switch element, wherein a first terminal of the third switch element is used as a first terminal of the memory cell, a second terminal of the third switch element is connected to one terminal of the non-volatile memory device, a third terminal of the third switch element is used as a third terminal of the memory cell, and a second terminal of the non-volatile memory device is used as a second terminal of the memory cell.

Further, the non-volatile memory device is a resistance-variable memory device, a phase-variable memory device, or a spintronic memory device.

According to another aspect of the present disclosure, a memory cell array structure is provided, comprising: a plurality of memory cell sub-arrays arranged in an array, wherein the memory cell sub-array comprises: a plurality of switch units and a plurality of memory cells arranged in an array, wherein for each memory cell, a threshold voltage of the memory cell is adjustable, a first terminal of the memory cell is connected to a source line corresponding to the column of the memory cell sub-array where the memory cell is located, a second terminal of the memory cell is connected to a bit line corresponding to the column of the memory cell sub-array where the memory cell is located, a third terminal of the memory cell is connected to a word line corresponding to the row of the memory cell sub-array where the memory cell is located through a switch unit corresponding to the row of the memory cell sub-array where the memory cell is located, for each switch unit, the control terminal of the switch unit is connected to a local word line corresponding to the memory cell sub-array, wherein whether each memory cell sub-array is activated is controlled via the local word line corresponding to the memory cell sub-array.

Further, controlling whether to activate the memory cell sub-array via the local word line corresponding to the memory cell sub-array comprises: when the local word line corresponding to the memory cell sub-array controls the memory cell sub-array to be activated, the local word line corresponding to the memory cell sub-array controls all switch units in the memory cell sub-array to be in a closed state; when the local word line corresponding to the memory cell sub-array controls the memory cell sub-array to be inactivated, the local word line corresponding to the memory cell sub-array controls all switch units in the memory cell sub-array to be in an open state.

Further, each switch unit comprises: a first switch element; and a second switch element; wherein a first terminal of the first switch element receives a first level, a second terminal of the first switch element is connected to a first terminal of the second switch element, a second terminal of the second switch element is connected to a word line corresponding to the switch unit, a third terminal of the first switch element and a third terminal of the second switch element are both connected to the local word line corresponding to the memory cell sub-array where the switch unit is located, and third terminals of all memory cells in a row of the memory cell sub-array corresponding to the switch unit are connected to a connection point of the second terminal of the first switch element and the first terminal of the second switch element.

Further, when the memory cell sub-array where the switch unit is located is activated, the first switch element of the switch unit is in off state, and the second switch element of the switch unit is in on state.

Further, the memory cell sub-array where the switch unit is located is inactivated, the first switch element of the switch unit is in on state, and the second switch element of the switch unit is in off state.

Further, the memory cell is a programmable semiconductor device.

Further, the programmable semiconductor device is a floating gate transistor.

Further, the memory cell comprises: a non-volatile memory device; and a third switch element, wherein a first terminal of the third switch element is used as a first terminal of the memory cell, a second terminal of the third switch element is connected to one terminal of the non-volatile memory device, a third terminal of the third switch element is used as a third terminal of the memory cell, and a second terminal of the non-volatile memory device is used as a second terminal of the memory cell.

Further, the non-volatile memory device is a resistance-variable memory device, a phase-variable memory device, or a spintronic memory device.

For the above-mentioned computing-in-memory chip and the memory cell array structure, exemplary embodiments are provided and described in detail below with reference to the accompanying drawings.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

DESCRIPTION OF EMBODIMENTS

In order to make those skilled in the art better understand the solutions in the present application, the technical solutions in the embodiments of the present application will be clearly and completely described below in conjunction with the accompanying drawings in the embodiments of the present application. The described embodiments are merely some of, rather than all, the embodiments of the present application. All other embodiments obtained by those of ordinary skill in the art based on the embodiments of the present application without creative effort shall fall within the protection scope of the present application.

It should be noted that the terms "comprise", "have" and any variants thereof in the specification, claims, and the above accompanying drawings of the present application are intended to cover a non-exclusive inclusion, for example, a process, method, system, product, or device that comprises a list of steps or units is not necessarily limited to those explicitly listed steps or units, but may comprise other steps or units not explicitly listed or inherent to such a process, method, product, or device.

It should be noted that the embodiments in the present application and the features in the embodiments can be combined with each other without conflict. The present application will be described in detail below with reference to the accompanying drawings and in conjunction with the embodiments.

Unless otherwise specified, the expression "an element A being connected to an element B" means that the element A is connected to the element B "directly" or "indirectly" by means of one or more other elements.

An existing computing-in-memory chip is usually provided with a plurality of memory cell arrays. Each of the plurality of memory cell arrays needs to be provided with corresponding peripheral circuits such as a digital-to-analog converter, an analog-to-digital converter, a conversion apparatus, and a decoder, which results in a large circuit area per memory cell array and a corresponding high cost, and thus the requirements for integration and low cost are not met by such computing-in-memory chips.

To resolve the above technical problem in the prior art, in a computing-in-memory chip, whether to activate each memory cell sub-array in a memory cell array of the computing-in-memory chip is controlled by means of a local word line in the memory cell sub-array. In this way, all memory cell sub-arrays in each row of memory cell sub-arrays share a plurality of DACs, and all memory cell sub-arrays in each column of memory cell sub-arrays share a plurality of ADCs, thereby reducing a circuit area, reducing a circuit cost, and meeting the requirements for integration and a low cost.

Figure 1:
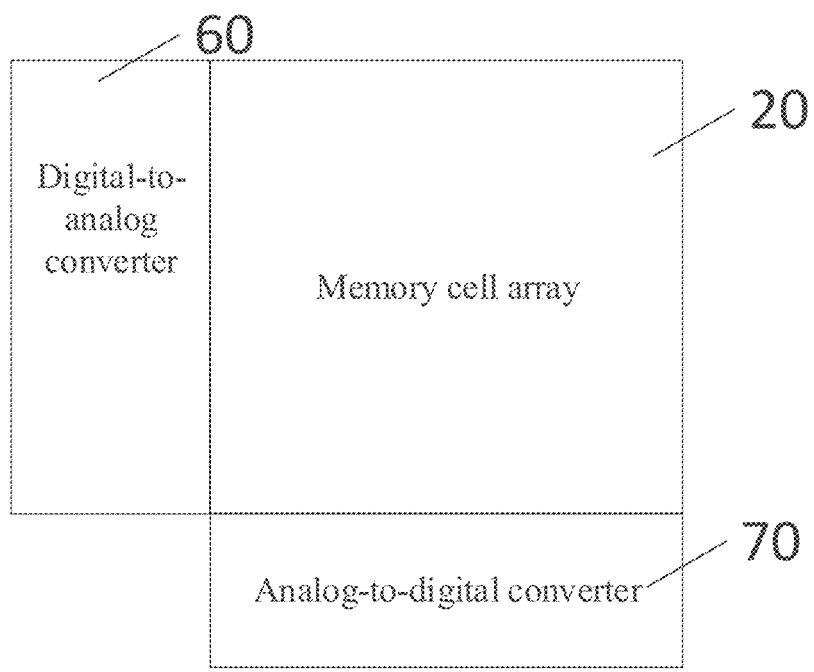
FIG. 1 is a structural diagram of a computing-in-memory chip according to some embodiments.

FIG. 1 shows a structural diagram of a computing-in-memory chip according to an embodiment of the present invention. As shown in FIG. 1, the computing-in-memory chip comprises a digital-to-analog converter 60, a memory cell array 20, and an analog-to-digital converter 70.

The digital-to-analog converter is configured to convert a digital signal into an analog signal; the memory cell array is connected to the digital-to-analog converter and is configured to perform an analog vector-matrix multiplication operation on the analog signal and output an analog operation result; and the analog-to-digital converter is connected to the memory cell array and is configured to convert the analog operation result into a digital output signal.

Figure 2:
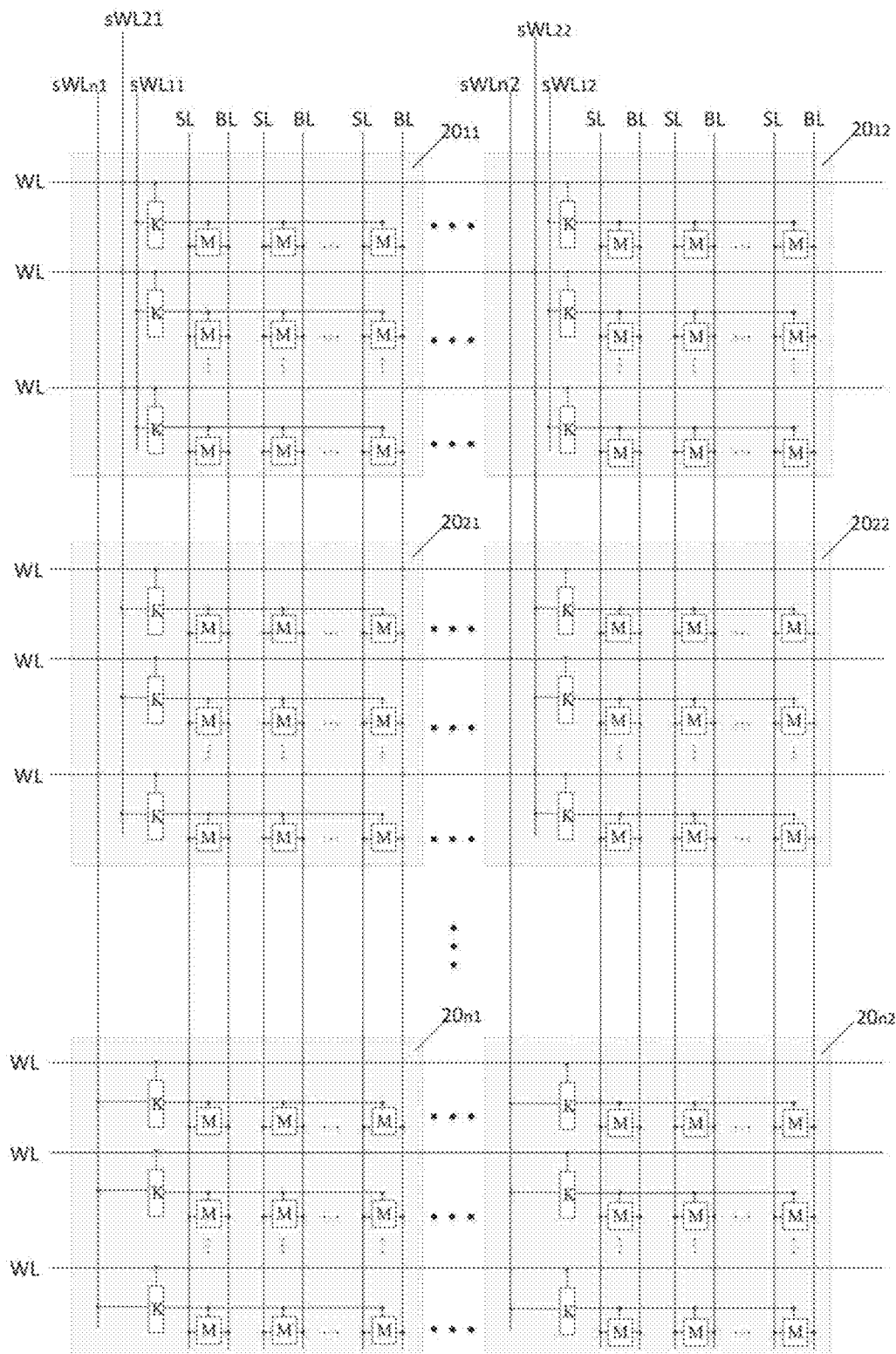
FIG. 2 is a first circuit diagram of a memory cell array according to some embodiments.

Specifically, referring to FIG. 2, the memory cell array comprises a plurality of memory cell sub-arrays $20_{11}$ to $20_{nm}$ arranged in an array and configured to perform different analog vector-matrix multiplication operations.

Each memory cell sub-array comprises a plurality of switch units K and a plurality of memory cells M arranged in an array, a threshold voltage of the memory cells being adjustable. By adjusting the threshold voltage of the memory cells, each memory cell is considered as a variable equivalent analog weight, which is equivalent to analog matrix data. An analog voltage is applied to the memory cell array to implement a matrix multiplication operation function.

First terminals of all memory cells in each column are connected to a source line SL, second terminals of all the memory cells are connected to a bit line BL, third terminals of all memory cells in each row are connected to a word line WL through a switch unit K, a plurality of rows of memory cells are correspondingly connected to a plurality of switch units, control terminals of the plurality of switch units are all connected to a local word line $SWL_{11}$ of the memory cell sub-array, and whether to activate the memory cell sub-array is controlled by controlling the local word line.

Specifically, when the memory cell sub-array is required to participate in an operation, the local word line $SWL_{11}$ is controlled, so as to activate or not activate the memory cell sub-array, by controlling an on/off state of each switch unit in the memory cell sub-array.

According to some embodiments, when the local word line corresponding to the memory cell sub-array controls the memory cell sub-array to be activated, the local word line corresponding to the memory cell sub-array controls all switch units in the memory cell sub-array to be in a closed state; when the local word line corresponding to the memory cell sub-array controls the memory cell sub-array to be inactivated, the local word line corresponding to the memory cell sub-array controls all switch units in the memory cell sub-array to be in an open state.

In order to make those skilled in the art fully understand the solutions of the embodiments described herein, an operation process of the memory cell array is described in conjunction with FIGS. 1 and 2.

First, a memory cell sub-array that needs to be put into operation is activated by controlling a local word line of each memory cell sub-array in the memory cell array.

A signal to be operated can be a digital signal with a plurality of digital bits, each digital bit is converted into an analog signal by means of a corresponding DAC, and a plurality of digital bits are respectively converted into a plurality of analog signals by means of a plurality of DACs. The plurality of analog signals are respectively input to a corresponding plurality of word lines WL the activated memory cell sub-array. After an analog vector-matrix multiplication operation is performed by the activated memory cell sub-array, operation results are output by means of a plurality of bit lines the activated memory cell sub-array. The plurality of bit lines in the activated memory cell sub-array correspond to (e.g., are coupled to) a plurality of ADCs, and a plurality of analog signals output by the plurality of bit lines are converted into digital signals (e.g., a corresponding plurality of digital signals) by the plurality of ADCs and then output.

Figure 3:
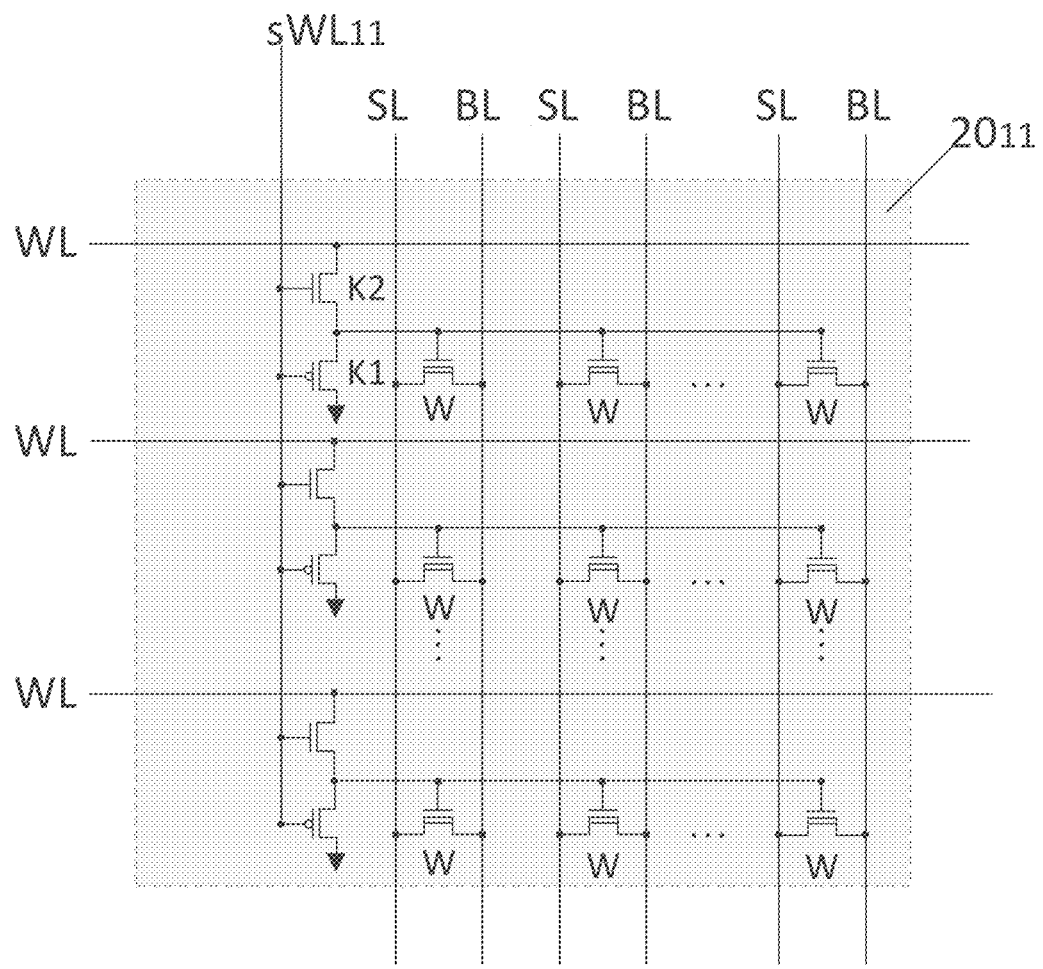
FIG. 3 is a circuit diagram of a memory cell sub-array in FIG. 2.

Optionally, as shown in FIG. 3, each switch unit comprises: a first switch element K1; and a second switch element K2; and wherein a first terminal of the first switch element K1 receives a first level (e.g., circuit ground), a second terminal of the first switch element is connected to a first terminal of the second switch element, a second terminal of the second switch element is connected to a word line corresponding to the switch unit, a third terminal of the first switch element and a third terminal of the second switch element are both connected to the local word line corresponding to the memory cell sub-array where the switch unit is located, and third terminals of all memory cells in a row of the memory cell sub-array corresponding to the switch unit are connected to a connection point of the second terminal of the first switch element and the first terminal of the second switch element.

Those skilled in the art can understand that the switch element can be implemented by an NMOS transistor or a PMOS transistor, a first terminal of the switch element can be a source, a second terminal of the switch element can be a drain, and a third terminal of the switch element can be a gate. In some embodiments, the first terminal of the switch element is the drain, and the second terminal of the switch element is the source, according to the type of transistor.

In addition, the first level may be the low level or the level of ground (e.g., circuit ground).

The first switch element may be an NMOS transistor, and the second switch element may be a PMOS transistor; or the first switch element may be a PMOS transistor, and the second switch element may be an NMOS transistor, provided when the memory cell sub-array where the switch unit is located is activated, the first switch element of the switch unit is in off state, and the second switch element of the switch unit is in on state.

For example, if the first switch element is a PMOS transistor and the second switch element is an NMOS transistor, when a high level is applied to the local word line of one memory cell sub-array, the NMOS transistor acting as the second switch element is turned on, the PMOS transistor acting as the first switch element is turned off, the memory cell sub-array is activated, and a third terminal of each memory cell receives an input signal on a word line. When a low level is applied to the local word line of one memory cell sub-array, the NMOS transistor acting as the second switch element is turned off, the PMOS transistor acting as the first switch element is turned on, the memory cell sub-array is not activated, and the third terminal of each memory cell is grounded by means of the PMOS transistor.

Figure 4:
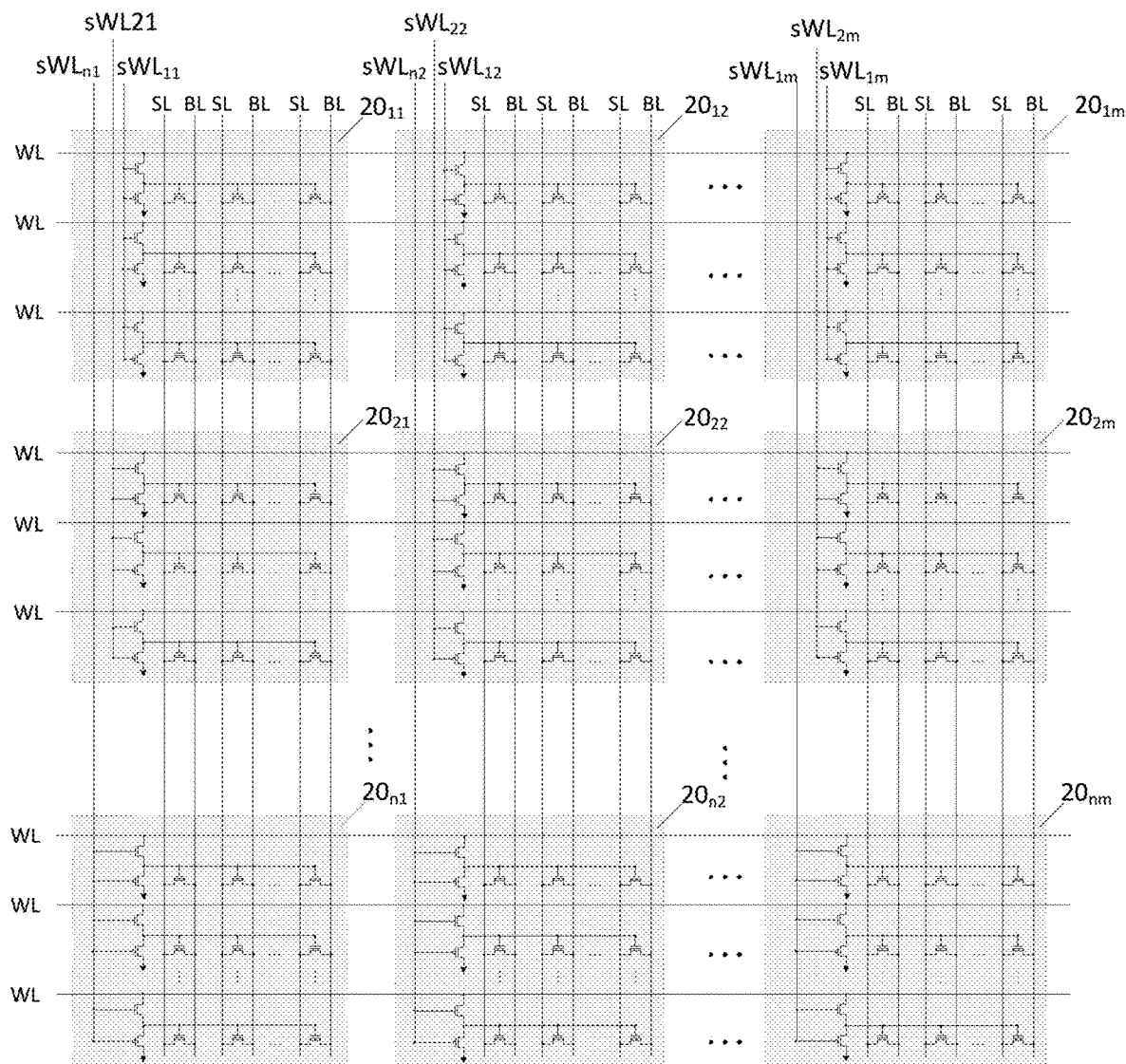
FIG. 4 is a second circuit diagram of a memory cell array according to some embodiments.

Referring to FIG. 3, in some embodiments each memory cell in the memory cell array is a programmable semiconductor device, and the programmable semiconductor device is a three-terminal device, such as a floating gate transistor. A first terminal of a respective memory cell in the memory cell array may be a source of the floating gate transistor, a second terminal of the memory cell may be a drain of the floating gate transistor, and a third terminal of the memory cell may be a gate of the floating gate transistor. Alternatively, the first terminal of the memory cell in some embodiments may be the drain of the floating gate transistor, and the second terminal of the memory cell may be the source of the floating gate transistor. FIG. 4 shows a circuit diagram of a memory cell array when the memory cells in the memory cell array are floating gate transistors.

Figure 5:
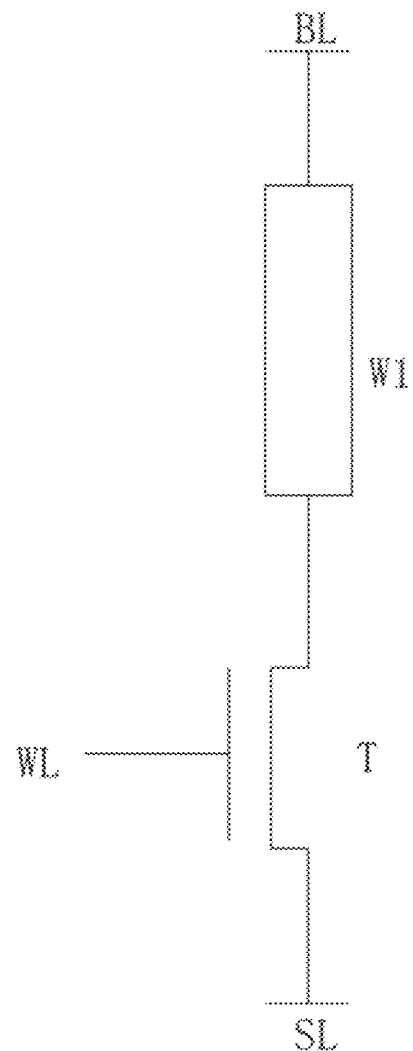
FIG. 5 shows a circuit structure of a memory cell according to some embodiments.

In some embodiments, referring to FIG. 5, the memory cell comprises a non-volatile memory device W1 and a switch element T; and a first terminal of the switch element T is used as a first terminal of the memory cell, a second terminal of the switch element is connected to one terminal of the non-volatile memory device W1, a third terminal of the switch element is used as a third terminal of the memory cell, and a second terminal of the non-volatile memory device W1 is used as a second terminal of the memory cell.

The non-volatile memory device may be a resistance-variable memory device, a phase-variable memory device, a spintronic memory device, etc.

Figure 6:
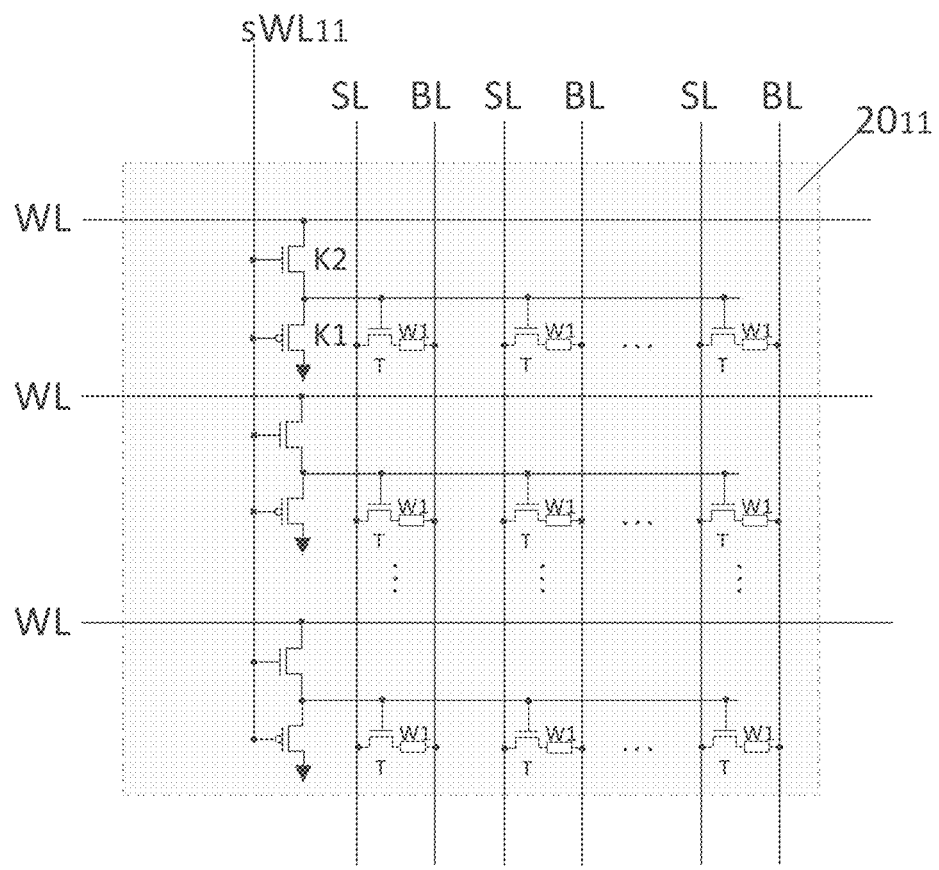
FIG. 6 is another circuit diagram of a memory cell sub-array in FIG. 2.

Those skilled in the art can understand that the switch element can be implemented by an NMOS transistor or a PMOS transistor, a first terminal of the switch element can be a source, a second terminal of the switch element can be a drain, and a third terminal of the switch element can be a gate. Alternatively, in some embodiments, the first terminal of the switch element may be the drain, and the second terminal of the switch element may be the source, according to the type of transistor. FIG. 6 shows a circuit structure of a memory cell sub-array when the memory cells in the memory cell sub-array are each composed of a switch element and a non-volatile memory device.

It should be noted that the computing-in-memory chip has two operation modes, one of which is time-division operation of part of memory cell sub-arrays, and the other is parallel operation of part of memory cell sub-arrays.

Taking the use of the computing-in-memory chip to implement neural network operations as an example, the principle of time-division operation of part of memory cell sub-arrays is described below.

Figure 7:
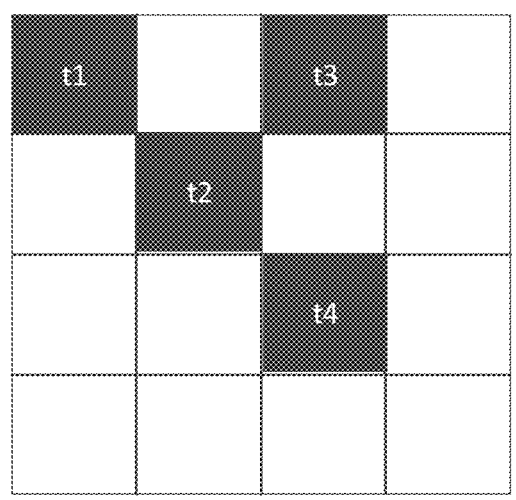
FIG. 7 is a schematic diagram of time-division working of a plurality of memory cell sub-arrays according to some embodiments.

A neural network generally contains a plurality of layers of neurons, and each layer of neurons mainly implements a matrix multiplication operation. An operation of the following layer of neurons of depends on the operation result of the previous layer of neurons. Therefore, operations of various layers of neurons are performed in a time-division manner. Taking a four-layer neural network as an example, each layer of neurons corresponds to one matrix multiplication operation, four memory cell sub-arrays are used to implement operations of four layers of neurons, and the four memory cell sub-arrays work in a time-division manner. In this case, any four memory cell sub-arrays t1 to t4 can be selected (see FIG. 7), and threshold voltages of memory cells in the four memory cell sub-arrays t1 to t4 are configured in advance. In other words, each memory cell stores a piece of weight data (e.g., a respective weight datum) and is equivalent to a neuron in the neural network. The four memory cell sub-arrays t1 to t4 respectively implement operations of the first to fourth layers of neurons in the neural network. During the operation, the memory cell sub-array t1 is first activated, then an input feature is input to a word line corresponding to the memory cell sub-array t1, and output from a bit line corresponding to the memory cell sub-array t1 is the operation result of the first layer of neurons. Then, the memory cell sub-array t2 is activated, the operation result of the first layer of neurons is input to a word line corresponding to the memory cell sub-array t2, and output from a bit line corresponding to the memory cell sub-array t2 is an operation result of the first layer of neurons. Similar actions are performed until an operation result of the four-layer neural network is finally obtained.

Some memory cell sub-arrays are used to work in a time-division manner, so that all memory cell sub-arrays in each row share a plurality of DACs, and all memory cell sub-arrays in each column share a plurality of ADCs, thereby reducing the circuit area, reducing the circuit cost, and meeting requirements for integration and low cost.

In addition, for some complex operations, or for some operations with a large operation scale, part of memory cell sub-arrays are required to work in parallel so as to implement the required operations. In this case, since the data input to a plurality of memory cell sub-arrays working in parallel may be different, and the data output by those memory cell sub-arrays may also be different, it is necessary to select a plurality of memory cell sub-arrays that are neither in the same row nor in the same column to participate in the operation.

Figure 8:
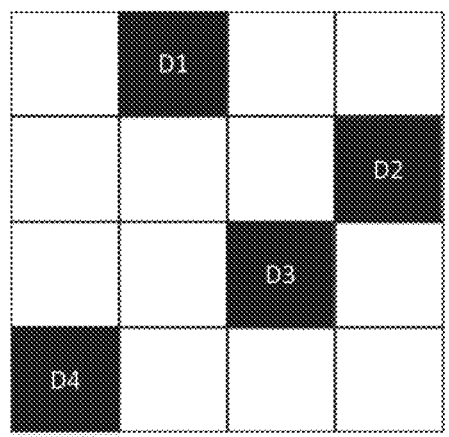
FIG. 8 is a schematic diagram of concurrent working of a plurality of memory cell sub-arrays according to some embodiments.

For example, when four memory cell sub-arrays are required to work in parallel so as to implement a large-scale operation, referring to FIG. 8, four memory cell sub-arrays D1 to D4 that are neither in the same row nor in the same column may be selected to participate in the operation simultaneously, and threshold voltages of memory cells in the four memory cell sub-arrays D1 to D4 are configured in advance. Each memory cell??>> is equivalent to storing one piece of weight data. During the operation, the memory cell sub-arrays D1 to D4 are activated by controlling local word lines of the memory cell sub-arrays D1 to D4, then input features are input to word lines corresponding to the memory cell sub-arrays D1 to D4, and data output on bit lines corresponding to the memory cell sub-arrays D1 to D4 is the operation result.

In some embodiments, to improve adaptability, a plurality of memory cell sub-arrays that are neither in the same row nor in the same column are selected to participate in the operation in parallel. As a result, embodiments described herein can be adapted to large-scale or even ultra-large-scale operations, such a neural network with a large number of operations in image processing, navigation, etc. In this case, the operation corresponding to each layer of neurons can be implemented by a plurality of memory cell sub-arrays working in parallel, thereby adapting to different operational tasks, and greatly improving the use flexibility of the computing-in-memory chip.

In some embodiments, the digital-to-analog converter 60 comprises a plurality of DACs, the plurality of DACs being respectively connected to front ends of a plurality of word lines and being configured to convert a digital signal applied to the word lines into analog signals.

In some embodiments, the analog-to-digital converter 70 comprises a plurality of ADCs, the plurality of ADCs being respectively connected to back ends of a plurality of bit lines and being configured to convert analog operation results on the bit lines into digital output signals.

Figure 9:
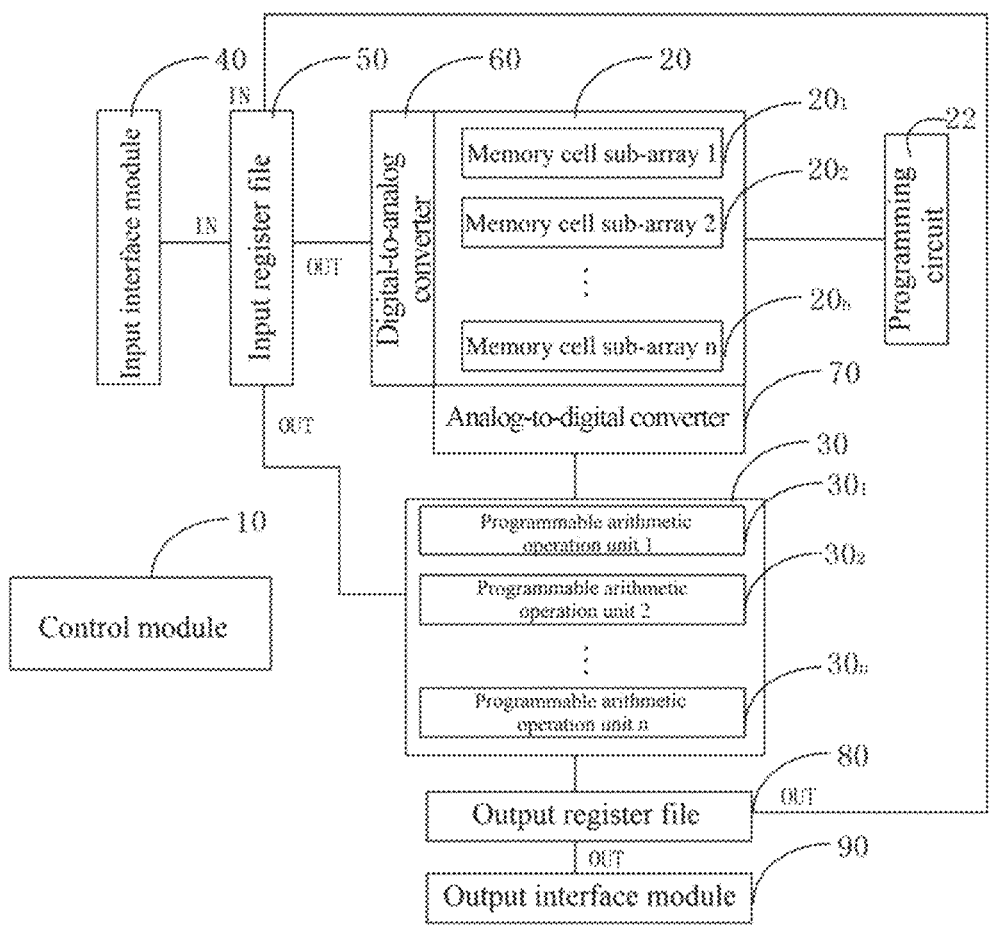
FIG. 9 is a structural diagram of another computing-in-memory chip according to some embodiments.

In some embodiments, as shown in FIG. 9, the computing-in-memory chip may further comprise a programmable arithmetic operation module 30, the programmable arithmetic operation module 30 being arranged at an output terminal of the analog-to-digital converter 70 and being configured to perform arithmetic operations on the digital output signal.

Those skilled in the art can understand that for some complex operations, in addition to the analog vector-matrix multiplication operation, some arithmetic operations such as one or several combinations of the multiplication operation, the addition operation, the subtraction operation, the division operation, the shift operation, the activation function, taking a maximum value, taking a minimum value, taking an average value, and pooling are also required, to obtain the final operation result.

Therefore, the programmable arithmetic operation module is arranged at the output terminal of the analog-to-digital converter, so that further arithmetic operations are performed on the operation result output by the memory cell array, the applicability of the computing-in-memory chip is improved, and the application range is expanded.

In some embodiments, the programmable arithmetic operation module 30 comprises a plurality of programmable arithmetic operation units $30_1$ to $30_n$ for separately implementing different arithmetic operations. The programmable arithmetic operation units are implemented by hardware and are configured to perform specific arithmetic operations.

Figure 10:
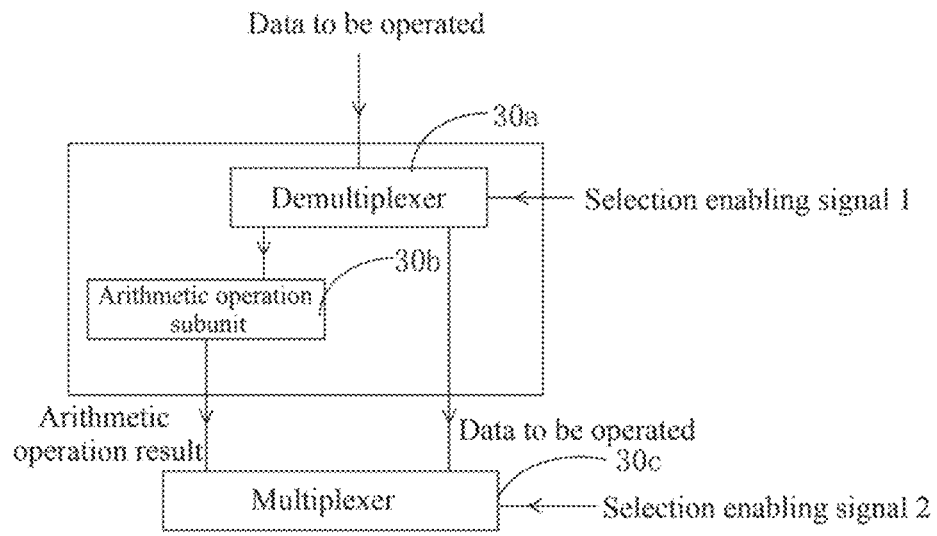
FIG. 10 is a structural diagram of a programmable arithmetic operation unit 30 according to some embodiments.

In some embodiments, the plurality of programmable arithmetic operation units $30_1$ to $30_n$ of the programmable arithmetic operation module 30 are serially connected, and each of the programmable arithmetic operation units comprises a demultiplexer 30a, an arithmetic operation subunit 30b, and a multiplexer 30c, referring to FIG. 10.

An input terminal of the demultiplexer 30a is connected to a previous programmable arithmetic operation unit or the analog-to-digital converter 70, one output terminal of the demultiplexer 30a is connected to the arithmetic operation subunit 30b, and an output terminal of the arithmetic operation subunit 30b and the other output terminal of the demultiplexer 30a are connected to a next programmable arithmetic operation unit or an output register file 80 by means of the multiplexer 30c. In addition, control terminals of the demultiplexer 30a and the multiplexer 30c are all connected to the control module 10.

Specifically, an input terminal of a demultiplexer in the first programmable arithmetic operation unit $30_1$ is connected to the output terminal of the analog-to-digital converter 70, one output terminal of the demultiplexer is connected to an input terminal of an arithmetic operation subunit in the first programmable arithmetic operation unit $30_1$, the other output terminal of the demultiplexer and the output terminal of the arithmetic operation subunit are connected to the input terminal of the second programmable arithmetic operation unit $30_2$ by means of a multiplexer, and control terminals of the demultiplexer and the multiplexer are connected to the control module 10.

An input terminal of a demultiplexer in the second programmable arithmetic operation unit $30_2$ is connected to an output terminal of the first programmable arithmetic operation unit $30_1$, one output terminal of the demultiplexer is connected to the input terminal of an arithmetic operation subunit in the second programmable arithmetic operation unit $30_2$, the other output terminal of the demultiplexer and the output terminal of the arithmetic operation subunit are connected to an input terminal of the third programmable arithmetic operation unit $30_3$ by means of a multiplexer, and control terminals of the demultiplexer and the multiplexer are connected to the control module 10. By analogy, for an $n^{th}$ programmable arithmetic operation unit $30_n$, the input terminal of the demultiplexer in the $n^{th}$ programmable arithmetic operation unit $30_n$ is connected to the output terminal of the $(n-1)^{th}$ programmable arithmetic operation unit $30_{n-1}$, one output terminal of the demultiplexer is connected to the input terminal of an arithmetic operation subunit in the $n^{th}$ programmable arithmetic operation unit $30_n$, the other output terminal of the demultiplexer and the output terminal of the arithmetic operation subunit are connected to the input terminal of the output register file 80 by means of a multiplexer, and control terminals of the demultiplexer and the multiplexer are connected to the control module 10.

The control module 10 connects and controls a demultiplexer and a multiplexer in each programmable arithmetic operation unit, to select whether an arithmetic operation subunit in the programmable arithmetic operation unit participates in operation, so as to implement a permutation and combination configuration of a plurality of programmable arithmetic operation units, implement different complex operations, and flexibly configure arithmetic operation functions.

Figure 11:
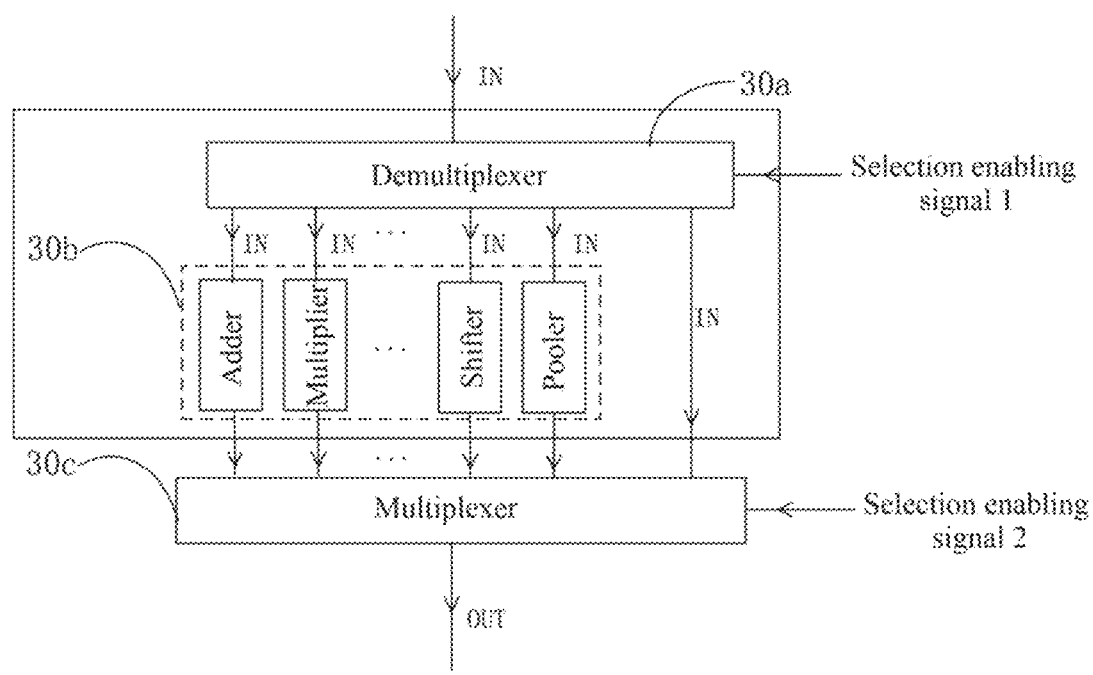
FIG. 11 is a structural diagram of a programmable arithmetic operation subunit according to some embodiments.

In some embodiments, each programmable arithmetic operation subunit may comprise a plurality of arithmetic operators arranged abreast, such as one or more of the multiplier, the adder, the subtracter, the divider, the shifter, the function activator, the operator for taking a maximum value, the operator for taking a minimum value, the operator for taking an average value, and the pooler. The arithmetic operators are connected in parallel, input terminals of the arithmetic operators are separately connected to the output terminals of the corresponding demultiplexers, and output terminals of the arithmetic operators are separately connected to the input terminals of the corresponding multiplexers, referring to FIG. 11.

Figure 12:
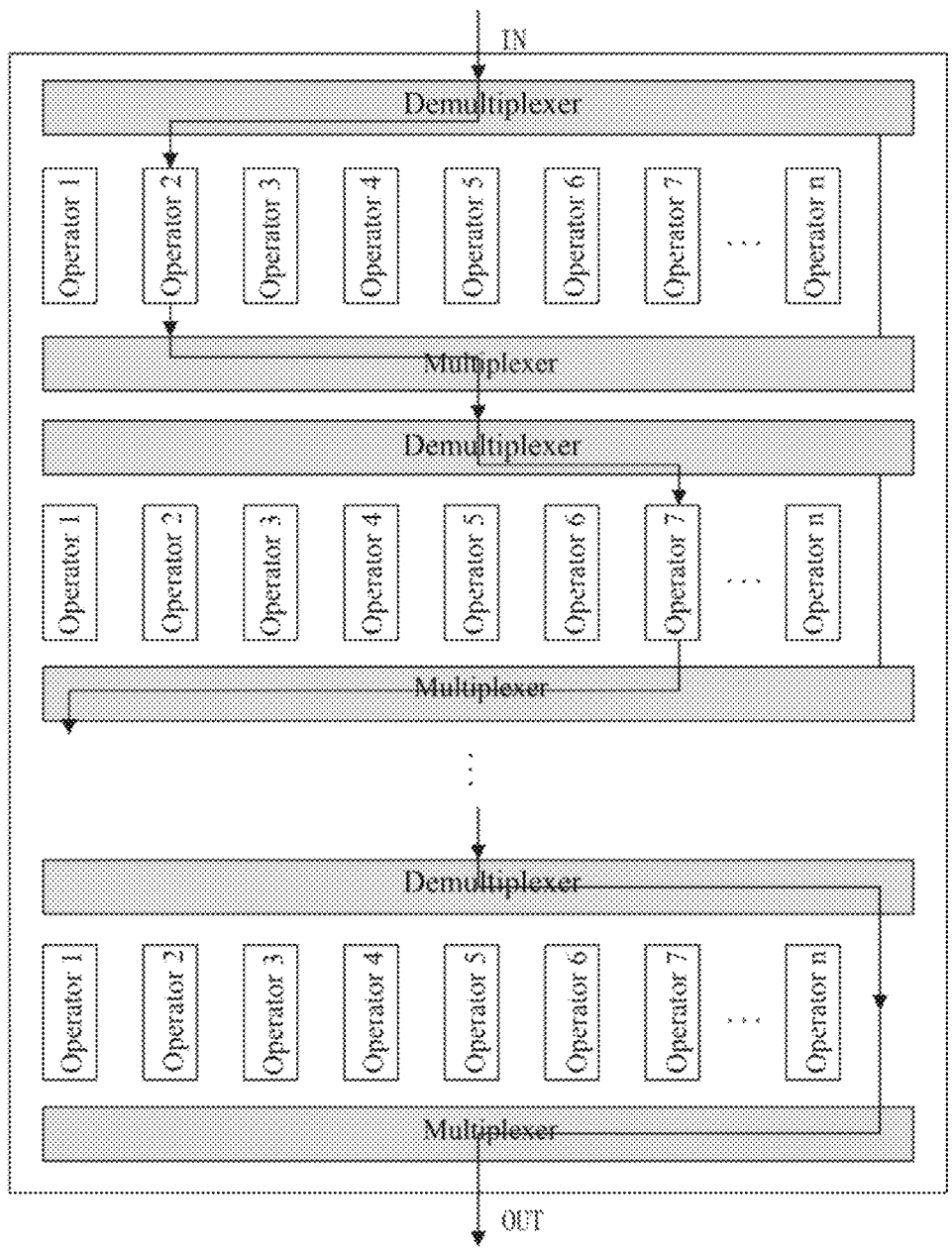
FIG. 12 is a schematic diagram of a programmable arithmetic operation module implementing a complex operation according to some embodiments.

A process of performing a complex operation by the programmable arithmetic operation module is shown in FIG. 12.

In some embodiments, the computing-in-memory chip may further comprise an input interface 40, an input register file 50, an output register file 80, an output interface module 90, and a control module 10.

The control module 10 dynamically configures a chip topology according to configuration information and finite state machine information.

The configuration information and the finite state machine information can be obtained by means of a compiling tool according to actual application requirements.

The configuration information is usually static, for example, the configuration information specifies the status of each module participating in a task, and the configuration size of each unit; and the configuration information is usually stored in a memory and is scheduled before the task runs. The finite state machine information is usually dynamic. When the task runs, the finite state machine information controls a time sequence and a status when an actual task runs.

Specifically, the control module 10 performs combination configuration on the plurality of memory cell sub-arrays and the plurality of programmable arithmetic operation units according to the configuration information, selects memory cell sub-arrays and programmable arithmetic operation units to be put into operation, and controls a combination and pairing manner of the memory cell sub-arrays and the programmable arithmetic operation units to achieve a specific operation.

It can be understood that each of the plurality of programmable arithmetic operation units can implement one or several arithmetic operations, and the plurality of programmable arithmetic operation units can implement a plurality of complex operations through permutation and combination, and cooperate with a plurality of memory cell sub-arrays to implement a plurality of combination configurations, thereby implementing complex operation functions.

The input terminal of the input interface module 40 is connected to an external device for receiving input data (that is, data on which operations need to be performed) from the external device.

The input terminal of the input register file 50 is connected to the output terminal of the input interface module 40 for temporarily storing the input data or data to be processed.

The input terminal of the digital-to-analog converter 60 is connected to the output terminal of the input register file 50, and the output terminal of the digital-to-analog converter is connected to the input terminal of the memory cell array 20 for converting, into an analog signal, the external input data or the data to be processed output from the input register file 50 and outputting same to the memory cell array 20. The memory cell array 20 performs an analog vector-matrix multiplication operation on the analog signal and outputs an analog vector-matrix multiplication operation result.

The input terminal of the analog-to-digital converter 70 is connected to the memory cell array 20, and the output terminal of the analog-to-digital converter is connected to the programmable arithmetic operation module 30 for converting the analog vector-matrix multiplication operation result into a digital signal and outputting same to the programmable arithmetic operation module 30. The programmable arithmetic operation module 30 performs an arithmetic operation on the digital signal and outputs an arithmetic operation result.

The input terminal of the output register file 80 is connected to the programmable arithmetic operation module 30, and the output terminal of the output register file is connected to the input register file 50 for temporarily storing the arithmetic operation result and outputting the arithmetic operation result or inputting same to the input register file 50 as the data to be processed.

The input terminal of the output interface module 90 is connected to the output terminal of the output register file 80 for receiving output data of the output register file 80 and outputting the output data to the external device.

Specifically, the input terminal of the input register file 50 is connected to the output terminal of the input interface module 40 and the output terminal of the output register file 80 by means of a first multiplexer, so as to selectively receive external input data from the input interface module 40 or data to be processed from the output register file 80.

The output terminal of the output register file 80 is selectively connected to the input terminal of the output interface module 90 or the input terminal of the input register file 50 by means of a demultiplexer, so as to select whether to output the output result of the output register file 80 to the output interface module 90 or the input register file 50. When the output result of the output register file 80 is selected to be output to the input register file 50, the computing-in-memory chip is configured (e.g., dynamically configured) to perform another round of operational processing on the output result.

In some embodiments, the output terminal of the input register file 50 can further be selectively connected to the input terminal of the digital-to-analog converter 60 or the input terminal of the programmable arithmetic operation module 30 by means of a demultiplexer, so as to select whether to connect the output terminal of the input register file 50 to the input terminal of the digital-to-analog converter 60 or the input terminal of the programmable arithmetic operation module 30. When the output terminal of the input register file 50 is connected to the input terminal of the digital-to-analog converter 50, an analog vector-matrix multiplication operation and an arithmetic operation are performed on the output of the input register file 50. When the output terminal of the input register file 50 is connected to the input terminal of the programmable arithmetic operation module 30, the computing-in-memory chip is configured (e.g., dynamically configured) to perform arithmetic operations on the output of the input register file 50, thereby further increasing the flexibility of the chip architecture.

In some embodiments, the software-defined computing-in-memory chip may further comprise a programming circuit 22, the programming circuit 22 being connected to the control module 10.

The programming circuit 22 is connected to a source, a gate, and/or a substrate of each memory cell in a memory cell array, for regulating a threshold voltage of the memory cell under the control of the control module 10.

The programming circuit comprises a voltage generation circuit for generating a programming voltage or an erasing voltage and a voltage control circuit for applying the programming voltage to a selected memory cell.

Specifically, by using a hot electron injection effect, the programming circuit applies a high voltage to the source of the memory cell according to threshold voltage requirement data of the memory cell, so as to accelerate channel electrons to a high speed, thereby increasing the threshold voltage of the memory cell.

In addition, by using a tunneling effect, the programming circuit applies a high voltage to the gate or the substrate of the memory cell according to the threshold voltage requirement data of the memory cell, thereby reducing the threshold voltage of the memory cell.

In addition, the control module 10 is connected to the programming circuit for controlling the programming circuit, so as to adjust the weight data stored in the memory cell array 20.

In some embodiments, the computing-in-memory chip may further comprise a row-column decoder. The row-column decoder is connected to the memory cell array 20 and the control module 10 for performing row-column decoding on the memory cell array 20 under the control of the control module 10.

In some embodiments, without limitation, the memory cell array may be a NOR-type flash memory cell array, a NAND-type flash memory cell array, an RRAM device, etc.

In some embodiments, the computing-in-memory chip further comprises a conversion apparatus, the conversion apparatus comprising a plurality of conversion branches, and the plurality of conversion branches being respectively connected to output terminals of a plurality of DACs and being configured to convert analog current signals output by the DACs into analog voltage signals.

Figure 13:
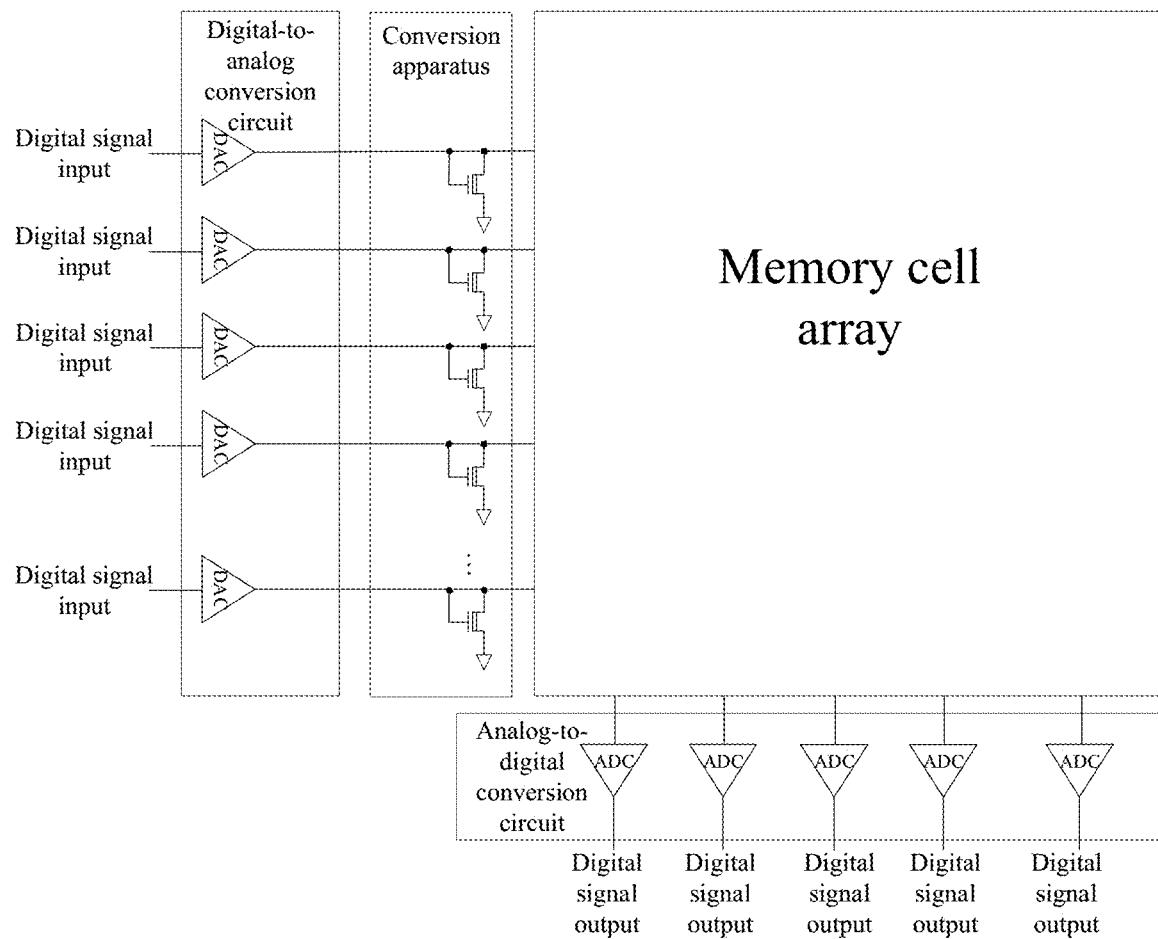
FIG. 13 is a structural diagram of still another computing-in-memory chip according to some embodiments.

In some embodiments, referring to FIG. 13, the conversion apparatus comprises a plurality of conversion branches, each conversion branch comprises a memory cell, a gate of the memory cell is connected to a drain and is connected to a corresponding analog voltage input terminal, and a source of the memory cell receives a first bias voltage.

It can be understood that the first bias voltage received by the source may be a ground voltage, that is, the source is grounded.

In some embodiments, the conversion branch comprises a resistor, one terminal of the resistor is connected to the output terminal of a DAC, and the other terminal of the resistor receives the first bias voltage. It can be understood that the first bias voltage may be a ground voltage, that is, the other terminal of the resistor is grounded.

In summary, according to the computing-in-memory chip provided by the embodiments described herein, a large memory cell array is divided into n small arrays, and each sub-array correspondingly completes matrix multiplication and addition operations of one layer of a neural network, and a plurality of sub-arrays (neither in the same row nor in the same column) can work in parallel, which can reduce the circuit area, reduce the cost, increase the throughput, increase the concurrency, and increase the operation processing speed. At the same time, multi-task time division multiplexing is compatible and flexible and convenient use is implemented.

In another aspect, a memory cell array structure includes: a plurality of memory cell sub-arrays arranged in an array, wherein the memory cell sub-array comprises: a plurality of switch units and a plurality of memory cells arranged in an array, wherein for each memory cell, a threshold voltage of the memory cell is adjustable, a first terminal of the memory cell is connected to a source line corresponding to the column of the memory cell sub-array where the memory cell is located, a second terminal of the memory cell is connected to a bit line corresponding to the column of the memory cell sub-array where the memory cell is located, a third terminal of the memory cell is connected to a word line corresponding to the row of the memory cell sub-array where the memory cell is located through a switch unit corresponding to the row of the memory cell sub-array where the memory cell is located, for each switch unit, the control terminal of the switch unit is connected to a local word line corresponding to the memory cell sub-array, wherein whether each memory cell sub-array is activated is controlled via the local word line corresponding to the memory cell sub-array.

Specifically, when the memory cell sub-array is required to participate in the operation, the local word line $SWL_{11}$ is controlled, so as to control to activate or not activate the memory cell sub-array by controlling an on/off state of each switch unit in the memory cell sub-array.

In some embodiments, the switch unit comprises: a first switch element (e.g., K1 in FIG. 3); and a second switch element (e.g., K2 in FIG. 3), wherein a first terminal of the first switch element receives a first level, a second terminal of the first switch element is connected to a first terminal of the second switch element, a second terminal of the second switch element is connected to a word line corresponding to the switch unit, a third terminal of the first switch element and a third terminal of the second switch element are both connected to the local word line corresponding to the memory cell sub-array where the switch unit is located, and third terminals of all memory cells in a row of the memory cell sub-array corresponding to the switch unit are connected to a connection point of the second terminal of the first switch element and the first terminal of the second switch element.

When the memory cell sub-array where the switch unit is located is activated, the first switch element of the switch unit is in off state, and the second switch element of the switch unit is in on state.

Those skilled in the art can understand that the switch element can be implemented by an NMOS transistor or a PMOS transistor, a first terminal of the switch element can be a source, a second terminal of the switch element can be a drain, and a third terminal of the switch element can be a gate. Alternatively, the first terminal of the switch element may be the drain, and the second terminal of the switch element may be the source, according to the type of transistor.

In addition, the first level may be a low level or a ground level.

The first switch element may be an NMOS transistor, and the second switch element may be a PMOS transistor; or the first switch element may be a PMOS transistor, and the second switch element may be an NMOS transistor, provided when the memory cell sub-array where the switch unit is located is activated, the first switch element of the switch unit is in off state, and the second switch element of the switch unit is in on state.

In some embodiments, the memory cell is a programmable semiconductor device. The programmable semiconductor device is a three-terminal device, such as a floating gate transistor. A first terminal of the memory cell may be the source of the floating gate transistor, a second terminal of the memory cell may be the drain of the floating gate transistor, and a third terminal of the memory cell may be the gate of the floating gate transistor. Alternatively, the first terminal of the memory cell in the embodiments of the present invention may be the drain of the floating gate transistor, and the second terminal of the memory cell may be the source of the floating gate transistor.

In some embodiments, the memory cell comprises a non-volatile memory device and a transistor; and a first terminal of the transistor is used as a first terminal of the memory cell, a second terminal of the transistor is connected to one terminal of the non-volatile memory device, a third terminal of the transistor is used as a third terminal of the memory cell, and another (e.g., a second) terminal of the non-volatile memory device is used as a second terminal of the memory cell.

The non-volatile memory device may be a resistance-variable memory device, a phase-variable memory device, a spintronic memory device, etc.

Those skilled in the art can understand that the switch element can be implemented by an NMOS transistor or a PMOS transistor, the first terminal of the switch element can be the source, the second terminal of the switch element can be the drain, and the third terminal of the switch element can be the gate. Alternatively, the first terminal of the switch element may be the drain, and the second terminal of the switch element may be the source, according to the type of transistor.

For more details of the memory cell array structure, reference may be made to the memory cell array in the above computing-in-memory chip. Details are not repeated herein.

It can be learned from the above technical solution that the memory cell array structure can flexibly control the number of memory cell sub-arrays participating in the operation, and can remove idle memory cell sub-arrays or damaged memory cell sub-arrays, so as to reduce energy consumption and increase the service life and the use flexibility of the memory cell array.

In some embodiments, an electronic device includes the above computing-in-memory chip.

The electronic device can be, for example, a personal computer, a laptop computer, a cellular phone, a camera phone, a smart phone, a personal digital assistant, a media player, a navigation device, an email device, a game console, a tablet computer, a wearable device, or a combination of any devices in the devices.

The principle and implementation of the present invention have been illustrated with reference to the specific embodiments in the present invention, and the above illustration of the embodiments is merely for the purpose of assisting in understanding the method of the present invention and its core concept. For those of ordinary skill in the art, various changes could be made in the particular embodiments and the scope of application in accordance with the idea of the present invention. In summary, the content of the description should not be construed as limiting the present invention.

What is claimed is:

1. A computing-in-memory chip, comprising:
   a digital-to-analog converter configured to convert a received digital signal into an analog signal, and output the analog signal;
   a memory cell array configured to receive the analog signal from the digital-to-analog converter, perform an analog vector-matrix multiplication operation on the analog signal and output an analog operation result of the analog vector-matrix multiplication operation, wherein the memory cell array comprises:
   a plurality of memory cell sub-arrays arranged in an array, which are configured to perform different analog vector-matrix multiplication operations, wherein each memory cell sub-array comprises a plurality of switch units and a plurality of memory cells arranged in an array, wherein for each memory cell, a threshold voltage of the memory cell is adjustable, a first terminal of the memory cell is connected to a source line corresponding to a column of the memory cell sub-array where the memory cell is located, a second terminal of the memory cell is connected to a bit line corresponding to the column of the memory cell sub-array where the memory cell is located, and a third terminal of the memory cell is connected to a word line, corresponding to a row of the memory cell sub-array where the memory cell is located, through a switch unit corresponding to the row of the memory cell sub-array where the memory cell is located, and wherein for each switch unit, a control terminal of the switch unit is connected to a local word line corresponding to the memory cell sub-array;
   an analog-to-digital converter configured to receive the analog operation result from the memory cell array and convert the analog operation result into a digital output signal,
   wherein whether each memory cell sub-array is activated is controlled via the local word line corresponding to the memory cell sub-array.

2. The computing-in-memory chip according to claim 1, wherein controlling whether each memory cell sub-array is activated via the local word line corresponding to the memory cell sub-array comprises:
   when the local word line corresponding to the memory cell sub-array controls the memory cell sub-array to be activated, the local word line corresponding to the memory cell sub-array controls all switch units in the memory cell sub-array to be in a on state;
   when the local word line corresponding to the memory cell sub-array controls the memory cell sub-array to be inactivated, the local word line corresponding to the memory cell sub-array controls all switch units in the memory cell sub-array to be in an off state.

3. The computing-in-memory chip according to claim 1, wherein each switch unit comprises:
   a first switch element; and
   a second switch element;
   wherein a first terminal of the first switch element receives a first voltage level, a second terminal of the first switch element is connected to a first terminal of the second switch element, a second terminal of the second switch element is connected to a word line corresponding to the switch unit, a third terminal of the first switch element and a third terminal of the second switch element are both connected to the local word line corresponding to the memory cell sub-array where the switch unit is located, and third terminals of all memory cells in a row of the memory cell sub-array corresponding to the switch unit are connected to a connection point of the second terminal of the first switch element and the first terminal of the second switch element.

4. The computing-in-memory chip according to claim 3, wherein when the memory cell sub-array where the switch unit is located is activated, the first switch element of the switch unit is in off state, and the second switch element of the switch unit is in on state.

5. The computing-in-memory chip according to claim 4, wherein when the memory cell sub-array where the switch unit is located is inactivated, the first switch element of the switch unit is in on state, and the second switch element of the switch unit is in off state.

6. The computing-in-memory chip according to claim 1, wherein the memory cell is a programmable semiconductor device.

7. The computing-in-memory chip according to claim 6, wherein the programmable semiconductor device is a floating gate transistor.

8. The computing-in-memory chip according to claim 1, wherein the memory cell comprises:
   a non-volatile memory device; and
   a third switch element,
   wherein a first terminal of the third switch element is used as a first terminal of the memory cell, a second terminal of the third switch element is connected to one terminal of the non-volatile memory device, a third terminal of the third switch element is used as a third terminal of the memory cell, and a second terminal of the non-volatile memory device is used as a second terminal of the memory cell.

9. The computing-in-memory chip according to claim 8, wherein the non-volatile memory device is a resistance-variable memory device, a phase-variable memory device, or a spintronic memory device.

10. A memory cell array structure, comprising:
a plurality of memory cell sub-arrays arranged in an array, wherein each memory cell sub-array comprises:
a plurality of switch units and a plurality of memory cells arranged in an array, wherein for each memory cell, a threshold voltage of the memory cell is adjustable, a first terminal of the memory cell is connected to a source line corresponding to a column of the memory cell sub-array where the memory cell is located, a second terminal of the memory cell is connected to a bit line corresponding to the column of the memory cell sub-array where the memory cell is located, and a third terminal of the memory cell is connected to a word line corresponding to a row of the memory cell sub-array where the memory cell is located through a switch unit corresponding to the row of the memory cell sub-array where the memory cell is located, and wherein for each switch unit, a control terminal of the switch unit is connected to a local word line corresponding to the memory cell sub-array,
wherein whether each memory cell sub-array is activated is controlled via the local word line corresponding to the memory cell sub-array.

11. The memory cell array structure according to claim 10, wherein controlling whether each memory cell sub-array is activated via the local word line corresponding to the memory cell sub-array comprises:
when the local word line corresponding to the memory cell sub-array controls the memory cell sub-array to be activated, the local word line corresponding to the memory cell sub-array controls all switch units in the memory cell sub-array to be in a on state;
when the local word line corresponding to the memory cell sub-array controls the memory cell sub-array to be inactivated, the local word line corresponding to the memory cell sub-array controls all switch units in the memory cell sub-array to be in an off state.

12. The memory cell array structure according to claim 10, wherein each switch unit comprises:
a first switch element; and
a second switch element;
wherein a first terminal of the first switch element receives a first voltage level, a second terminal of the first switch element is connected to a first terminal of the second switch element, a second terminal of the second switch element is connected to a word line corresponding to the switch unit, a third terminal of the first switch element and a third terminal of the second switch element are both connected to the local word line corresponding to the memory cell sub-array where the switch unit is located, and third terminals of all memory cells in a row of the memory cell sub-array corresponding to the switch unit are connected to a connection point of the second terminal of the first switch element and the first terminal of the second switch element.

13. The memory cell array structure according to claim 12, wherein when the memory cell sub-array where the switch unit is located is activated, the first switch element of the switch unit is in off state, and the second switch element of the switch unit is in on state.

14. The memory cell array structure according to claim 13, wherein when the memory cell sub-array where the switch unit is located is inactivated, the first switch element of the switch unit is in on state, and the second switch element of the switch unit is in off state.

15. The memory cell array structure according to claim 10, wherein the memory cell is a programmable semiconductor device.

16. The memory cell array structure according to claim 15, wherein the programmable semiconductor device is a floating gate transistor.

17. The memory cell array structure according to claim 10, wherein the memory cell comprises:
a non-volatile memory device; and
a third switch element,
wherein a first terminal of the third switch element is used as a first terminal of the memory cell, a second terminal of the third switch element is connected to one terminal of the non-volatile memory device, a third terminal of the third switch element is used as a third terminal of the memory cell, and a second terminal of the non-volatile memory device is used as a second terminal of the memory cell.

18. The memory cell array structure according to claim 17, wherein the non-volatile memory device is a resistance-variable memory device, a phase-variable memory device, or a spintronic memory device.

* * * * *